(12) United States Patent
Moussy et al.

(10) Patent No.: US 9,780,247 B2
(45) Date of Patent: Oct. 3, 2017

(54) SPAD-TYPE PHOTODIODE

(71) Applicant: Commissariat à l'Énergie Atomique et aux Énergies Alternatives, Paris (FR)

(72) Inventors: Norbert Moussy, Sainte Agnes (FR); Jean-Louis Ouvrier-Buffet, Sevrier (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/280,177

(22) Filed: Sep. 29, 2016

(65) Prior Publication Data
US 2017/0092801 A1    Mar. 30, 2017

(30) Foreign Application Priority Data

Sep. 30, 2015 (FR) ...................................... 15 59237

(51) Int. Cl.
| | |
|---|---|
| *H01L 31/107* | (2006.01) |
| *H01L 31/0352* | (2006.01) |
| *H01L 31/0224* | (2006.01) |

(52) U.S. Cl.
CPC .... *H01L 31/107* (2013.01); *H01L 31/022408* (2013.01); *H01L 31/035272* (2013.01)

(58) Field of Classification Search
CPC ........... H01L 31/107; H01L 31/022408; H01L 31/035272
USPC ........................................ 257/438, 355, 292
See application file for complete search history.

(56) References Cited

U.S. PATENT DOCUMENTS

| | | | |
|---|---|---|---|
| 8,093,624 B1 | 1/2012 | Renzi et al. | |
| 2005/0167709 A1* | 8/2005 | Augusto | ........... H01L 27/14643 257/292 |
| 2011/0095388 A1 | 4/2011 | Richter et al. | |
| 2013/0001694 A1* | 1/2013 | Guan | ................... H01L 27/0255 257/355 |
| 2014/0210035 A1 | 7/2014 | Park et al. | |
| 2014/0266409 A1* | 9/2014 | Lin | ........................ G05F 3/02 327/534 |
| 2014/0291481 A1 | 10/2014 | Zhang et al. | |

(Continued)

OTHER PUBLICATIONS

French Search Report, dated Aug. 15, 2016, from related French No. 15/59237.

(Continued)

*Primary Examiner* — Bo Fan
(74) *Attorney, Agent, or Firm* — Wolf, Greenfield & Sacks, P.C.

(57) ABSTRACT

A SPAD including, in a substrate of a first conductivity type: a first region of the second conductivity type extending from the upper surface of the substrate; a second region of the first type of greater doping level than the substrate, extending from the lower surface of the first region, having a surface area smaller than that of the first region and being located opposite a central portion of the first region; a third region of the first type of greater doping level than the substrate extending from the upper surface of the substrate, laterally surrounding the first region; and a fourth buried region of the first type of greater doping level than the substrate, forming a peripheral ring connecting the second region to the third region.

10 Claims, 1 Drawing Sheet

(56) References Cited

U.S. PATENT DOCUMENTS

2014/0339398 A1* 11/2014 Mazzillo ............... H01L 31/107
  250/208.2
2015/0054111 A1* 2/2015 Niclass ................ H01L 31/107
  257/438

OTHER PUBLICATIONS

Savuskan et al.: "Single Photon Avalanche Diode Collection Efficiency Enhancement via Peripheral Well-Controlled Field," 2015 IEEE Transactions on Electron Devices; pp: 1939-1945.
Charbon et al.: "SPAD-Based Sensors," 2013 TOF Range-Imaging Cameras 1-38.

* cited by examiner

SPAD-TYPE PHOTODIODE

CROSS-REFERENCED TO RELATED APPLICATION

This application claims the benefit of French patent application number 15/59237, the content of which is hereby incorporated by reference in its entirety to the maximum extent allowable by law.

BACKGROUND

The present disclosure relates to avalanche photodiodes for the detection of single photons, also called SPADs ("Single Photon Avalanche Diode").

DISCUSSION OF THE RELATED ART

A SPAD is essentially formed by a reverse PN junction reversely biased at a voltage higher than its avalanche threshold. When no electric charge is present in the depletion area or space charge area of the PN junction, the photodiode is in a pseudo-stable non-conductive state. When a photo-generated electric charge is injected into the depletion area, if the displacement speed of this charge in the depletion area is sufficiently high, that is, if the electric field in the depletion area is sufficiently intense, the photodiode is likely to start an avalanche. A single photon is thus capable of generating a measurable electric signal, and this, with a very short response time. SPADs enable to detect radiations of very low luminous intensity, and are in particular used for the detection of single photons and the counting of photons.

It would be desirable to be able to at least partly improve certain aspects of known SPADs.

SUMMARY

Thus, an embodiment provides a SPAD-type photodiode comprising, in a semiconductor substrate of a first conductivity type: a first region of the second conductivity type extending from the upper surface of the substrate; a second region of the first conductivity type having a greater doping level than the substrate, extending from the lower surface of the first region, the second region having, in top view, a surface area smaller than that of the first region and being located opposite a central portion of the first region; a third region of the first conductivity type having a doping level greater than that of the substrate extending from the upper surface of the substrate, the third region laterally surrounding the first region; and a fourth buried region of the first conductivity type having a doping level greater than that of the substrate, forming a peripheral ring connecting the second region to the third region so that the lateral surfaces and the lower surface of the first region are totally surrounded by the assembly formed by the second, third, and fourth regions.

According to an embodiment, the doping level of the substrate is smaller than $5*10^{14}$ atoms/cm3.

According to an embodiment, the doping level of the third region is greater than or equal to that of the second region.

According to an embodiment, thicknesses E105 and E203 of the second and fourth regions, and doping levels C105 and C203 of the second and fourth regions are such that product E105*C105 is substantially equal to product E203*C203.

According to an embodiment, the third and fourth regions are not in contact with the first region.

According to an embodiment, the third region is an implanted or diffused region formed in the substrate.

According to an embodiment, the third region is a trench filled with doped polysilicon.

According to an embodiment, a region of the same conductivity type as the substrate but of greater doping level extends in the substrate from the lateral walls of the trench.

According to an embodiment, the photodiode further comprises, on the rear surface side of the substrate, a layer of the same conductivity type as the substrate but of greater doping level.

According to an embodiment, the photodiode further comprises a circuit of application of a bias voltage between the first and second regions, this voltage being greater than the avalanche voltage of the photodiode and being such that the avalanche area of the photodiode is located opposite the central portion of the first region and does not extend opposite the peripheral portion of the first region.

The foregoing and other features and advantages will be discussed in detail in the following non-limiting description of specific embodiments in connection with the accompanying drawings.

DETAILED DESCRIPTION

Figure 1:
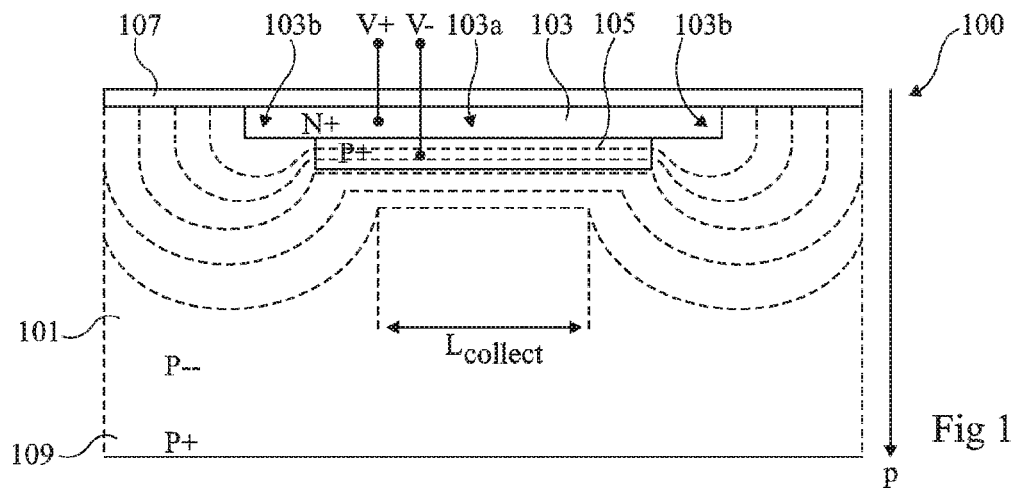
FIG. 1 is a partial simplified cross-section view of an example of a SPAD.

The same elements have been designated with the same reference numerals in the different drawings and, further, the various drawings are not to scale. For clarity, only those elements which are useful to the understanding of the described embodiments have been shown and are detailed. In particular, a SPAD generally comprises secondary circuits, particularly a circuit for biasing its PN junction to a voltage greater than its avalanche threshold, as well as a quenching circuit having the function of interrupting the avalanche of the photodiode once it has been triggered. Such secondary circuits have not been shown in the drawings and will not be detailed, the described embodiments being compatible with the secondary circuits equipping known SPADs. In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", "lateral", etc., it is referred to the orientation of the drawings, it being understood that, in practice, the described photodiodes may be oriented differently. Unless otherwise specified, expressions "approximately", "substantially", and "in the order of" mean to within 10%, preferably to within 5%, or when they concern angles or absolute or relative angular orientations, to within 10 degrees, and preferably to within 5 degrees.

A problem which is posed in known SPADs is that of the collection of the charges photogenerated in the substrate depth, at a distance remote from the avalanche area of the photodiode, that is, the portion of the photodiode depletion area where the electric field is sufficiently intense for the avalanche to be triggerable by a single charge. Indeed, beyond a certain distance from the PN junction, the electric field resulting from the reverse biasing of the PN junction becomes zero or strongly attenuates, and no longer enables to drive the photogenerated charges towards the avalanche area. Only the random diffusion in the substrate is then capable of conducting the photogenerated charges towards the avalanche area, with a non-negligible probability for the photogenerated charges never to reach the avalanche area or to reach it with a significant delay. This problem is especially posed when charges photogenerated under the effect of a luminous radiation of high wavelength, for example, a wavelength radiation in the range from 750 to 3,000 nm, are desired to be collected.

FIG. 1 is a partial simplified cross-section view of an example of a SPAD 100. Photodiode 100 comprises a semiconductor substrate 101, for example, made of silicon. In the shown example, substrate 101 is P-type doped. Photodiode 101 further comprises, in an upper portion of substrate 101, an N-type doped region 103 extending from the upper surface of the substrate and, under region 103, a P-type doped region 105, having a doping level greater than that of substrate 101, extending from the lower surface of region 103. As an example, region 103 has a thickness in the range from 50 to 250 nm, and region 105 has a thickness in the range from 100 to 500 nm. Region 105 has, in top view, a surface area smaller than that of region 103, and is located opposite a central portion 103a of region 103. A peripheral ring-shaped region 103b of region 103 thus laterally extends beyond the periphery of region 105. As an example, the width of peripheral region 103b is in the range from 0.1 to 2 μm. In the shown example, the lower surface and the lateral surface of peripheral region 103b of region 103 are in contact with substrate 101. Central region 103a of region 103 has its lower surface in contact with the upper surface of region 105. Thus, the PN junction of photodiode 100 comprises a central portion formed between region 105 and central portion 103a of region 103, and a peripheral portion formed between substrate 101 and peripheral portion 103b of region 103. In top view (not shown), regions 103 and 105 for example have a circular shape. The described embodiments are however not limited to this specific case. In the shown example, photodiode 100 further comprises a passivation layer 107, for example, made of silicon oxide, coating the upper surface of substrate 101. In the shown example, passivation layer 107 coats the entire surface of the photodiode. Passivation layer 107 may comprise openings (not shown) opposite contacting regions (not shown) for the biasing of substrate 101. Contact metallizations can then be formed in these openings. In this example, photodiode 100 further comprises, in a lower portion of substrate 101, a P-type doped region 109, having a smaller doping level than the substrate, extending in substrate 101 from its lower surface. As an example, layer 109 may be an initial substrate, for example, having a thickness from 700 to 850 μm, having substrate 101 formed by epitaxy on its upper surface. As a variation, layer 109 may be the upper single-crystal silicon layer of a silicon-on-insulator type stack (SOI), having substrate 101 formed on its upper surface by epitaxy. Layer 109 for example extends over substantially the entire surface of substrate 101. The thickness of substrate 101 located under region 105, that is, between the lower surface of region 105 and the upper surface of layer 109 in the shown example, is for example in the range from 1 to 20 μm.

In operation, region 103, forming the photodiode cathode, is biased to a positive potential V+, and region 105, forming the photodiode anode, is biased to a negative potential V−, so that the cathode-anode voltage of the photodiode is greater than its avalanche voltage.

For simplification, the contact terminals enabling to bias the photodiode have not been shown. As an example, the photodiode anode is biased via region 109, or via a contact region, not shown, located on the upper surface side of substrate 101, in a peripheral region of substrate 101.

When photodiode 100 is reverse-biased, an electric field appears at the PN junction of the photodiode. FIG. 1 shows in dash lines the equipotential lines in substrate 101 when photodiode 100 is reverse-biased. The electric field (not shown) in the photodiode is substantially orthogonal to the equipotential lines, and is all the more intense as the equipotential lines are close to one another. The space charge area of the PN junction and the electric field resulting from a reverse biasing of the PN junction extend all the deeper into substrate 101 as the reverse biasing voltage of the photodiode is high, and as the encountered doping levels are low. For a given bias voltage, the electric field generated at the PN junction is all the more intense as the doping levels of the P- and N-type regions forming the junction are high.

The doping levels of regions 103 and 105 and of substrate 101 and the photodiode bias voltage are for example selected so that the electric field at the central portion of the PN junction (at the interface between region 105 and central portion 103a of region 103) is sufficiently intense for the avalanche to be started by a single photogenerated charge, and so that the electric field at the peripheral portion of the PN junction (at the interface between substrate 101 and peripheral portion 103b of region 103) is sufficiently low for the avalanche not to be started by a single photogenerated charge. This enables to decrease risks of parasitic starting of the avalanche due to edge effects at the periphery of the PN junction.

Preferably, to enable to collect charges photogenerated in depth in substrate 101, that is, under region 105, substrate 101 is lightly doped, for example, with a doping level smaller than 5*1014 atoms/cm3. As an example, substrate 101 may be a non-intentionally doped semiconductor substrate, that is, a substrate having its P-type doping only resulting from its incidental contamination by impurities on manufacturing thereof. As illustrated in FIG. 1, as a result of the low doping level of substrate 101, the electric field generated by the reverse biasing of the photodiode extends into the substrate depth, at a distance from the PN junction of the photodiode. Under the effect of this electric field, the charges photogenerated in the substrate, in the case in point, electrons, are driven towards the PN junction by following a trajectory parallel to the electric field. As a variation, the extension of the electric field across the substrate thickness may also be obtained with a substrate having a higher doping level, provided to significantly increase the reverse bias voltage of the photodiode.

As illustrated in FIG. 1, the space charge area of the PN junction and the electric field resulting from the reverse biasing of the PN junction develop more deeply in the substrate at the level of the peripheral portion of the PN junction than at the level of the central portion thereof (due to the relatively low doping level of substrate 101 with respect to region 105). The equipotential lines which develop in the substrate around the periphery of the PN junction form rounded protrusions having a width (that is, a dimension which is horizontal or parallel to the upper surface of the substrate) increasing as the distance from the PN junction increases. Beyond a given depth (or distance from the upper surface of the substrate), the protrusions extend partially under region 105 of the photodiode, that is, under the central portion of the PN junction, corresponding to the avalanche area of the photodiode. The electric field corresponding to the rounded protrusions points to a peripheral portion of the PN junction, where the collected charges do not enable to start the photodiode avalanche. The charges photogenerated in depth in substrate 101 are thus only likely to cause the avalanche of the photodiode if they are generated in a central portion of width Lcollect of the photodiode, width Lcollect being smaller than or equal than the width of region 105, and width Lcollect being all the smaller as the depth p at which the charge is generated in the substrate is large.

It would be desirable to have a SPAD enabling to collect charges photogenerated in the substrate depth with a better efficiency than the structure of FIG. 1.

Figure 2:
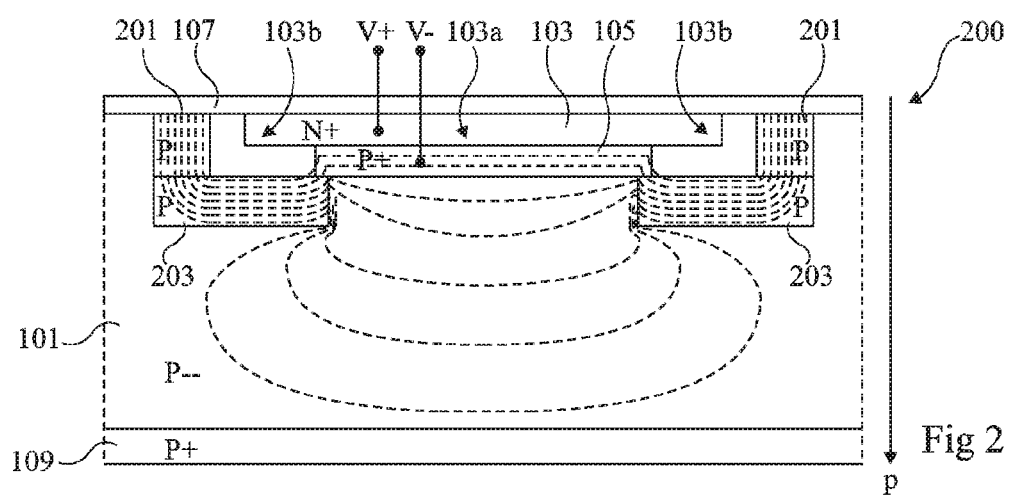
FIG. 2 is a partial simplified cross-section view of an embodiment of SPAD.

FIG. 2 is a partial simplified cross-section view of an embodiment of a SPAD 200. SPAD 200 of FIG. 2 comprises substantially the same elements as SPAD 100 of FIG. 1, arranged substantially in the same way. These elements will not be described again hereafter.

SPAD 200 further comprises a P-type region 201, having a greater doping level than substrate 101, extending vertically into substrate 101 from its upper surface, down to a depth greater than that of region 103, and forming a peripheral ring totally surrounding region 103 in top view. As an example, the doping level of region 201 is between the doping level of the substrate and the doping level of region 105. As a variation, the doping level of region 201 is greater than that of region 105. A non-zero distance preferably separates region 103 from region 201, for example, a distance in the range from 0.5 to 5 μm. In this example, region 201 extends down to a depth smaller than the substrate thickness, for example, down to a depth substantially equal to that of the lower surface of region 105.

Photodiode 200 further comprises a buried P-type region 203, of greater doping level than substrate 101, having its upper surface located at a depth greater than that of region 103, for example, at a depth greater than or equal to that of the lower surface of region 105. Region 203 extends, in particular, under peripheral region 103b of region 103. Region 203 forms a buried ring connecting region 201 to region 105 all along the periphery of the PN junction. Thus, regions 201, 203, and 105 form a continuous separation well totally surrounding the lateral surfaces and the lower surface of region 103, and interposed between region 103 and the lower portion of the substrate. The doping level of region 203 is for example identical or similar to that of region 105. In this example, region 203 extends down to a depth smaller than that of the lower surface of the substrate. As an example, the thickness of insulating layer 203 is in the range from 200 nm to 600 nm. Calling E105 the thickness of region 105, C105 the average concentration of dopant elements in region 105, E203 the thickness of region 203, and C203 the average concentration of dopant elements in region 203, values E105, C105, E203, C203 are for example such that product C203*E203 is approximately equal to product C105*E105.

As an example, the biasing of the anode region of the photodiode may be performed via regions 201 and 203. To achieve this, a connection metallization (not shown) may be arranged in contact with the upper surface of region 201, in an opening (not shown) formed in passivation layer 107.

The operation of photodiode 200 of FIG. 2 is similar to that of photodiode 100 of FIG. 1.

As in the example of FIG. 1, when photodiode 200 is reverse-biased, an electric field appears at the PN junction of the photodiode. FIG. 2 shows in dash lines the equipotential lines in substrate 101 when photodiode 200 is reverse biased.

The doping levels of regions 101, 103, 105, 201, and 203, the distance between region 201 and region 103, the distance between region 203 and region 103, and the bias voltage of the photodiode, are for example selected so that the electric field at the level of the central portion of the PN junction (at the interface between region 105 and central portion 103a of region 103) is sufficiently intense for the avalanche to be started by a single photogenerated charge, for example, is greater than 300 kV/cm across a thickness from 100 to 500 nm, and so that the electric field at the level of the peripheral portion of the PN junction (at the interface between substrate 101—the doping level of which may have locally increased due to the forming of buried region 203—and peripheral portion 103b of region 103) is sufficiently small for the avalanche not to be started by a single photogenerated charge, for example, is smaller than 300 kV/cm. As an example, the reverse breakdown voltage (or avalanche voltage) of the photodiode is in the range from 10 to 50 V, and the reverse bias voltage of the photodiode is greater than its breakdown voltage by a value in the range from 0.5 to 10 V.

As in the example of FIG. 1, substrate 101 of photodiode 200 is preferably lightly doped to ease the collection of the charges photogenerated in the substrate depth. As illustrated by the equipotential lines drawn in FIG. 2, the electric field resulting from the reverse biasing of the peripheral portion of the PN junction remains confined within regions 201 and 203, and does not or only slightly extends into the lower portion of substrate 101 (that is, into the portion of substrate 101 located outside of the separation well formed by regions 201, 203, and 105). In other words, in the embodiment of FIG. 2, the equipotential lines have, as in the example of FIG. 1, rounded protrusions around the peripheral portion of the PN junction, but the protrusions remain confined within regions 201 and 203, and do not extend under the central portion of the photodiode. The electric field resulting from the reverse biasing of the central portion of the PN junction extends in depth in substrate 101, under region 105. From a given depth p in substrate 101, substantially corresponding to the depth of the lower surface of region 203, the field lines take a flared shape, and an electric field pointing towards the avalanche area of the photodiode develops under a portion at least of the peripheral portion of the PN junction. Thus, in the embodiment of FIG. 2, the width of collection of the charges photogenerated in the substrate is always at least substantially equal to the width of the avalanche area (that is, substantially equal to the width of region 105), and may be greater than the width of the avalanche area for charges photogenerated in depth in substrate 101. More particularly, due to the continuity of the separation well formed by regions 201 and 203, the structure of FIG. 2 benefits from a "lens" effect, which makes it particularly adapted to the collection of charges photogenerated in depth in substrate 101.

As an example, in the structure of FIG. 2, the doping level of region 103 is in the range from $5*10^{17}$ to $5*10^{19}$ atoms/cm3, the doping level of region 105 is in the range from $1*10^{16}$ to $5*10^{17}$ atoms/cm3, the doping level of region 201 is in the range from $5*10^{17}$ to $5*10^{19}$ atoms/cm3, and the doping level of region 203 is in the range from $1*10^{16}$ to $5*10^{17}$ atoms/cm3. The distance between region 103 and region 201 and the distance between region 103 and region 203 are preferably such that the distance between the contour of the N-type dopant element concentration at 1017 atoms/cm3 and the contour of the P-type dopant element concentration at 1017 atoms/cm3 is at least 0.2 μm at the level of the peripheral portion of the PN junction.

Figure 3:
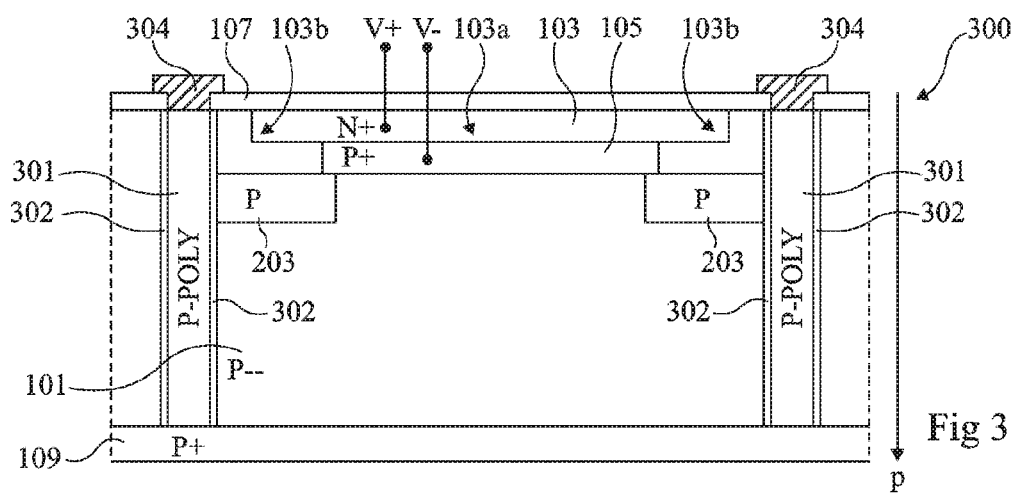
FIG. 3 is a partial simplified cross-section view of another embodiment of a SPAD.

FIG. 3 is a partial simplified cross-section view of another embodiment of a SPAD 300. SPAD 300 of FIG. 3 comprises many elements in common with SPAD 200 of FIG. 2. The common elements are not described again. In the following, only the differences between the structure of FIG. 2 and the structure of FIG. 3 will be detailed.

Photodiode 300 of FIG. 3 differs from photodiode 200 of FIG. 2 essentially in that, in the example of FIG. 3, a peripheral trench 301 filled with P-type doped polysilicon is substituted to P-type doped substrate region 201 of the structure of FIG. 2. Trench 301 extends vertically from the upper surface of the substrate down to a depth greater than that of region 103, and forms a peripheral ring totally surrounding region 103 in top view. In the shown example, trench 301 extends all the way to layer 109, and emerges into layer 109. Trench 301 is not isolated from substrate 101, that is, the P-type doped polysilicon filling trench 301 is in contact with substrate 101 at the level of the walls of trench 301. Preferably, a region 302 having a doping level greater than that of substrate 101 extends in the substrate from the lateral walls of trench 301. To form region 302, an anneal of the structure may for example be provided after the filling of the trench with P-type doped polysilicon, to diffuse into substrate 101 P-type dopant elements originating from the polysilicon. The provision of region 302 enables to avoid for the electric field lines to reach the walls of trench 301, which might attract parasitic charges generated at the interface with trench 301 towards the avalanche area. The doping level of the polysilicon filling trench 301 is greater than that of substrate 101. The doping level in trench 301 is for example greater than that of region 105. A non-zero distance preferably separates region 103 from trench 301.

Photodiode 300 of FIG. 3 comprises a buried P-type region 203 substantially identical to that of photodiode 200 of FIG. 2, connecting trench 301 to region 105 all along the periphery of the PN junction. Thus, regions 301, 203, and 105 form a continuous separation well totally surrounding the lateral surfaces and the lower surface of region 103, and interposed between region 103 and the lower portion of the substrate.

Due to the continuity of the separation between region 103 and the lower portion of the substrate, the structure of FIG. 3 provides, identically or similarly to what has been described in relation with FIG. 2, a significant improvement of the efficiency of the collection of the charges photogenerated in the substrate depth.

As an example, as shown in FIG. 3, the biasing of the anode region of the photodiode may be performed via trench 301. To achieve this, a connection metallization 304 may be arranged in contact with the upper surface of trench 301, in an opening formed in passivation layer 107.

Specific embodiments have been described. Various alterations, modifications, and improvements will readily occur to those skilled in the art. In particular, the above-described advantages may be obtained by inverting all the conductivity types with respect to the described examples.

Further, it should be noted that lower layer 109 of the described examples, of the same conductivity type as the substrate but of higher doping level, is optional. The provision of layer 109 has the advantage of limiting risks of injection, in the avalanche area, of parasitic charges generated on the rear surface side of the substrate. Layer 109 further enables to set the potential of the lower surface of the substrate and to provide a fine deployment of the electric field across the entire thickness of the substrate. Layer 109 may however be omitted, particularly in the case of a photodiode intended to be illuminated from its upper surface.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A SPAD-type photodiode comprising, in a semiconductor substrate, of a first conductivity type:
   a first region of a second conductivity type extending from the upper surface of the substrate;
   a second region of the first conductivity type having a greater doping level than the substrate, extending from the lower surface of the first region, the second region having, in top view, a surface area smaller than that of the first region and being located opposite a central portion of the first region;
   a third region of the first conductivity type having a doping level greater than that of the substrate extending from the upper surface of the substrate, the third region laterally surrounding the first region; and
   a fourth buried region of the first conductivity type having a doping level greater than that of the substrate, forming a peripheral ring connecting the second region to the third region so that the lateral surfaces and the lower surface of the first region are totally surrounded by the assembly formed by the second, third, and fourth regions.

2. The photodiode of claim 1, wherein the doping level of the substrate is smaller than $5*10^{14}$ atoms/cm$^3$.

3. The photodiode of claim 1, wherein the doping level of the third region is greater than or equal to that of the second region.

4. The photodiode of claim 1, wherein thicknesses E105 and E203 of the second and fourth regions, and doping levels C105 and C203 of the second and fourth regions are such that product E105*C105 is substantially equal to product E203*C203.

5. The photodiode of claim 1, wherein the third and fourth regions are not in contact with the first region.

6. The photodiode of claim 1, wherein the third region is an implanted or diffused region formed in the substrate.

7. The photodiode of claim 1, wherein the third region is a trench filled with doped polysilicon.

8. The photodiode of claim 7, wherein a region of the same conductivity type as the substrate but of greater doping level extends in the substrate from the lateral walls of the trench.

9. The photodiode of claim 1, further comprising, on the rear surface side of the substrate, a layer of the same conductivity type as the substrate but of greater doping level.

10. The photodiode of claim 1, further comprising a circuit of application of a bias voltage between the first and second regions, said voltage being greater than the avalanche voltage of the photodiode and being such that the avalanche area of the photodiode is located opposite the central portion of the first region and does not extend opposite the peripheral portion of the first region.

* * * * *